(12) United States Patent
Tong

(10) Patent No.: US 8,947,836 B2
(45) Date of Patent: Feb. 3, 2015

(54) TEST DEVICE FOR BUCK CIRCUIT

(71) Applicants: Hong Fu Jin Precision Industry (ShenZhen) Co., Ltd., Shenzhen (CN); Hon Hai Precision Industry Co., Ltd., New Taipei (TW)

(72) Inventor: Song-Lin Tong, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 53 days.

(21) Appl. No.: 13/909,114

(22) Filed: Jun. 4, 2013

(65) Prior Publication Data
US 2014/0002938 A1  Jan. 2, 2014

(30) Foreign Application Priority Data
Jul. 2, 2012 (CN) .......................... 2012 1 02245165

(51) Int. Cl.
H02H 7/00 (2006.01)
H02H 3/02 (2006.01)
G01R 31/40 (2014.01)
G01R 31/28 (2006.01)
H02M 1/32 (2007.01)

(52) U.S. Cl.
CPC ................ *H02H 3/02* (2013.01); *G01R 31/40* (2013.01); *G01R 31/2839* (2013.01); *H02M 1/32* (2013.01)

USPC ............................................................ 361/18

(58) Field of Classification Search
USPC ............................................................ 361/18
See application file for complete search history.

(56) References Cited

U.S. PATENT DOCUMENTS

| | | | |
|---|---|---|---|
| 5,241,443 A * | 8/1993 | Efantis | 361/36 |
| 5,498,995 A * | 3/1996 | Szepesi et al. | 327/538 |
| 5,847,910 A * | 12/1998 | Efantis et al. | 361/36 |
| 6,549,386 B1 * | 4/2003 | Koegel et al. | 361/93.1 |
| 2001/0053055 A1* | 12/2001 | Guedes | 361/100 |

OTHER PUBLICATIONS

"Evaluating DC-DC Converters with LF Network Analyzers", Agilent Technologies, Application Note. (Oct. 13, 2008).*

* cited by examiner

*Primary Examiner* — Scott Bauer
(74) *Attorney, Agent, or Firm* — Novak Druce Connolly Bove + Quigg LLP

(57) ABSTRACT

A test device includes a transformer, a loop analyzer, and a protection circuit. The protection circuit includes a control unit, a signal acquisition and amplification unit, and an electronic switch. When the loop analyzer outputs a signal, the signal acquisition and amplification unit acquires the signal output from the loop analyzer, amplifies the acquired signal, and outputs the amplified signal to the control unit. The control unit transforms the received signal from analog form to digital form, and compares the digital signal with a reference value. If the digital signal is greater than the reference value, the control unit outputs a control signal to the electronic switch, to turn off the electronic switch. The signal output from the loop analyzer cannot be transmitted to a buck circuit.

7 Claims, 1 Drawing Sheet

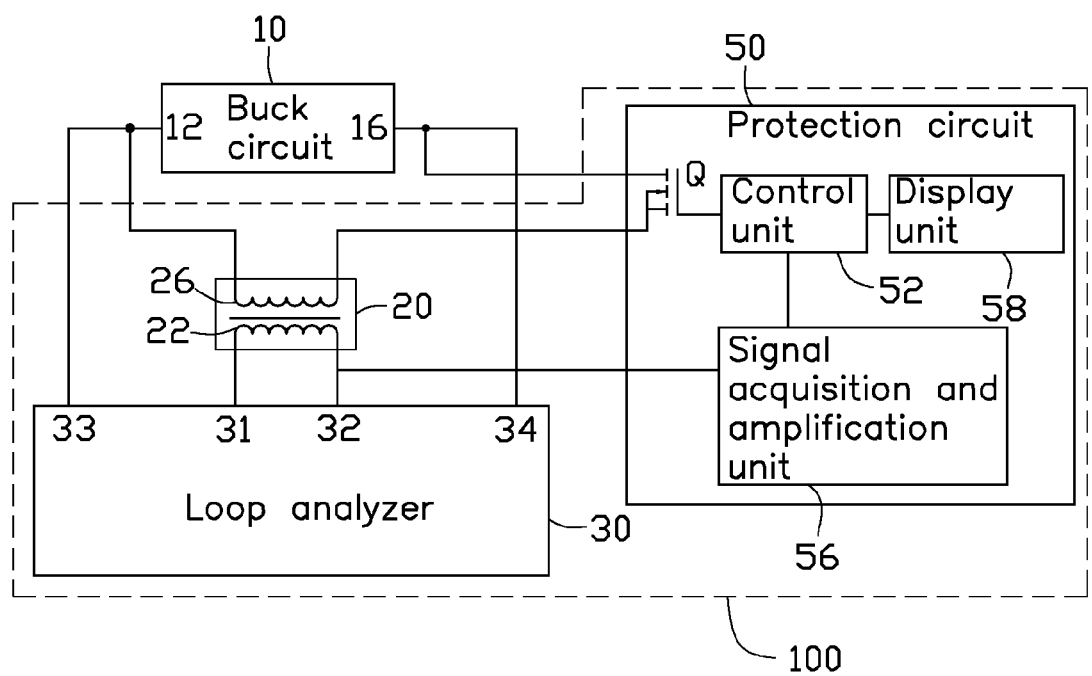

TEST DEVICE FOR BUCK CIRCUIT

BACKGROUND

1. Technical Field

The present disclosure relates to a test device.

2. Description of Related Art

During testing of a buck circuit, a reference value of a radio frequency (RF) signal output to the buck circuit is usually set in a loop analyzer before the test. However, when a fact setting value that is greater than the reference value is input by mistake, it will cause damage to the buck circuit.

BRIEF DESCRIPTION OF THE DRAWING

Many aspects of the present disclosure can be better understood with reference to the following drawing(s). The components in the drawing(s) are not necessarily drawn to scale, the emphasis instead being placed upon clearly illustrating the principles of the present disclosure. Moreover, in the drawing(s), like reference numerals designate corresponding parts throughout the several views.

The FIGURE is a block diagram of an embodiment of a test device connected to a buck circuit.

DETAILED DESCRIPTION

The FIGURE is a block diagram of an embodiment of a test device 100 connected to a buck circuit 10. The test device 100 includes a transformer 20, a loop analyzer 30, and a protection circuit 50. The test device 100 is used for testing the buck circuit 10.

The buck circuit 10 includes a first terminal 12 and a second terminal 16. The transformer 20 includes a primary coil 22 and a secondary coil 26. The loop analyzer 30 includes first to fourth signal terminals 31-34. The protection circuit 50 includes a control unit 52, a signal acquisition and amplification unit 56, a display unit 58, and an electronic switch Q.

The first signal terminal 31 of the loop analyzer 30 is grounded, and connected to a first end of the primary coil 22. The second signal terminal 32 of the loop analyzer 30 is connected to a second end of the primary coil 22, and connected to the signal acquisition and amplification unit 56, and outputs a radio frequency (RF) signal to the signal acquisition and amplification unit 56. The third signal terminal 33 of the loop analyzer 30 is connected to the first terminal 12 of the buck circuit 10. The fourth signal terminal 34 of the loop analyzer 30 is connected to the second terminal 16 of the buck circuit 10.

A first end of the secondary coil 26 is connected to the first terminal 12 of the buck circuit 10. A second end of the secondary coil 26 is connected to a first end of the electronic switch Q. A second end of the electronic switch Q is connected to the second terminal 16 of the buck circuit 10. A third end of the electronic switch Q is connected to the control unit 52.

In the embodiment, the transformer 20 is an isolation transformer. Number of windings of the primary coil 22 is the same as number of windings of the secondary coil 26. The control unit 52 can be a single chip computer, in one example. The display unit 58 can be a liquid crystal display (LCD), in one example.

In the embodiment, the electronic switch Q is an n-channel metal oxide semiconductor field-effect transistor (MOSFET), and the first to third ends of the electronic switch Q correspond to a source, a drain, and a gate of the MOSFET, respectively.

In use, the value of the RF signal output from the second signal terminal 32 of the loop analyzer 30 is set in the loop analyzer 30. The signal acquisition and amplification unit 56 receives the RF signal output from the second signal terminal 32, amplifies the RF signal, and outputs the amplified RF signal to the control unit 52. The control unit 52 transforms the RF signal from analog to digital to get a digital signal, and compares the digital signal with a reference value. The display unit 58 is controlled by the control unit 52 to display the digital signal and the reference value.

If the value of the digital signal is greater than the reference value, the control unit 52 outputs a low level voltage signal, such as logic 0. The electronic switch Q is turned off. The first end of the electronic switch Q is disconnected from the second end of the electronic switch Q. The RF signal output from the second signal terminal 32 cannot be transmitted to the buck circuit 10 through the transformer 20. Therefore, the buck circuit 10 is prevented from being damaged.

If the value of the digital signal is less than the reference value, the control unit 52 outputs a high level voltage signal, such as logic 1. The electronic switch Q is turned on. The first end of the electronic switch Q is connected to the second end of the electronic switch Q. The RF signal output from the second signal terminal 32 is transmitted to the buck circuit 10 through the transformer 20. The RF signal is transmitted from the second terminal 16 to the first terminal 12 of the buck circuit 10. The third signal terminal 33 receives the RF signal from the first terminal 12 of the buck circuit 10. The fourth signal terminal 34 receives the RF signal from the second terminal 16 of the buck circuit 10. Therefore, the loop analyzer 30 determines whether the RF signal received from the buck circuit 10 is same with the RF signal set in the loop analyzer 30, thereby testing the stability of the buck circuit 10.

While the disclosure has been described by way of example and in terms of preferred embodiment, it is to be understood that the disclosure is not limited thereto. To the contrary, it is intended to cover various modifications and similar arrangements as would be apparent to those skilled in the art. Therefore, the range of the appended claims should be accorded the broadest interpretation so as to encompass all such modifications and similar arrangements.

What is claimed is:

1. A test device for testing a buck circuit, the test device comprising:
    a transformer comprising a primary coil and a secondary coil, wherein a first end of the secondary coil is connected to a first terminal of the buck circuit;
    a protection circuit comprising a control unit, a signal acquisition and amplification unit, and an electronic switch, wherein a first end of the electronic switch is connected to a second end of the secondary coil, a second end of the electronic switch is connected to a second terminal of the buck circuit, the third end of the electronic switch is connected to the control unit, the control unit is connected to the signal acquisition and amplification unit; and
    a loop analyzer comprising first to fourth signal terminals, wherein the first signal terminal of the loop analyzer is connected to a first end of the primary coil, the second signal terminal of the loop analyzer is connected to a second end of the primary coil and the signal acquisition and amplification unit, the third signal terminal is connected to the first terminal of the buck circuit, the fourth signal terminal is connected to the second terminal of the buck circuit;

wherein when the second signal terminal of the loop analyzer outputs a signal to the signal acquisition and amplification unit, the signal acquisition and amplification unit amplifies the signal outputted from the loop analyzer, and outputs an amplified signal to the control unit; the control unit transforms the amplified signal from analog form to digital form to get a digital signal, and compares the digital signal with a reference value; if the value of the digital signal is greater than the reference value, the control unit outputs a first control signal to the electronic switch, to turn off the electronic switch; if the value of the digital signal is less than the reference value, the control unit outputs a second control signal to the electronic switch, to turn on the electronic switch; the loop analyzer determines whether the signal received from the buck circuit is same with the signal set in the loop analyzer.

2. The test device of claim 1, wherein the protection circuit further comprises a display unit connected to the control unit, and the display unit is controlled by the control unit to display the digital signal and the reference value.

3. The test device of claim 2, wherein the display unit is a liquid crystal display (LCD).

4. The test device of claim 1, wherein the control unit is a single chip computer.

5. The test device of claim 1, wherein the transformer is an isolation transformer, a number of windings of the primary coil is the same as a number of windings of the secondary coil.

6. The test device of claim 1, wherein the electronic switch is a metal oxide semiconductor field-effect transistor (MOSFET), the first to third ends of the electronic switch correspond to a source, a drain, and a gate of the MOSFET, respectively.

7. The test device of claim 1, wherein the signal outputted from the second signal terminal of the loop analyzer is a radio frequency signal.

\* \* \* \* \*